(12) United States Patent
Borland

(10) Patent No.: US 7,256,980 B2
(45) Date of Patent: *Aug. 14, 2007

(54) THIN FILM CAPACITORS ON CERAMIC

(76) Inventor: William J. Borland, 106 Turquoise Creek Dr., Cary, NC (US) 27513

( * ) Notice: Subject to any disclaimer, the term of this patent is extended or adjusted under 35 U.S.C. 154(b) by 34 days.

This patent is subject to a terminal disclaimer.

(21) Appl. No.: 11/005,350

(22) Filed: Dec. 6, 2004

(65) Prior Publication Data

US 2005/0141171 A1 Jun. 30, 2005

Related U.S. Application Data

(60) Provisional application No. 60/533,195, filed on Dec. 30, 2003.

(51) Int. Cl.
*H01G 4/06* (2006.01)

(52) U.S. Cl. .................... 361/311; 361/313; 361/321.1; 361/321.2; 361/306.1; 361/312; 438/295; 438/296

(58) Field of Classification Search ............. 361/306.1, 361/306.2, 306.3, 321.1, 321.2, 321.5, 311–313; 438/295–296

See application file for complete search history.

(56) References Cited

U.S. PATENT DOCUMENTS

| | | | |
|---|---|---|---|
| 5,198,269 A | 3/1993 | Swartz et al. | |
| 5,271,955 A | 12/1993 | Maniar | |
| 5,342,648 A | 8/1994 | MacKenzie et al. | |
| 5,384,294 A | 1/1995 | Teowee et al. | |
| 5,391,393 A | 2/1995 | Maniar | |
| 5,614,018 A | 3/1997 | Azuma et al. | |
| 5,912,044 A * | 6/1999 | Farooq et al. | 427/79 |
| 5,962,654 A | 10/1999 | Duncombe et al. | |
| 6,171,925 B1 * | 1/2001 | Graettinger et al. | 438/396 |
| 6,198,124 B1 * | 3/2001 | Sandhu et al. | 257/310 |
| 6,216,324 B1 | 4/2001 | Farooq et al. | |
| 6,275,370 B2 * | 8/2001 | Gnade et al. | 361/321.1 |
| 6,282,080 B1 * | 8/2001 | DeBoer et al. | 361/311 |
| 6,337,032 B1 | 1/2002 | Chivukula et al. | |
| 6,339,527 B1 * | 1/2002 | Farooq et al. | 361/305 |
| 6,404,615 B1 * | 6/2002 | Wijeyesekera et al. | 361/306.1 |
| 6,477,034 B1 | 11/2002 | Chakravorty et al. | |
| 6,493,207 B2 * | 12/2002 | Nakano et al. | 361/321.1 |
| 6,541,137 B1 | 4/2003 | Kingon et al. | |
| 6,611,419 B1 | 8/2003 | Chakravorty | |
| 6,727,143 B1 * | 4/2004 | Hui et al. | 438/256 |

(Continued)

FOREIGN PATENT DOCUMENTS

EP 0 378 989 A 7/1990

OTHER PUBLICATIONS

Q. Zou, H. E. Ruda, B. G. Yacobi, K. Saegusa, and M. Farrell, Dielectric Properties of Lead Zirconate Titanate Thin Films Deposited on Metal Foils, Applied Physics Letters, vol. 77, No. 7, Aug. 14, 2000, p. 1038-1040.

(Continued)

*Primary Examiner*—Nguyen T. Ha
(74) *Attorney, Agent, or Firm*—Loretta Smith (57) ABSTRACT

Thin-film capacitors are formed on ceramic substrates having high capacitance densities and other desirable electrical and physical properties. The capacitor dielectrics are annealed at high temperatures.

20 Claims, 4 Drawing Sheets

U.S. PATENT DOCUMENTS

| | | | |
|---|---|---|---|
| 6,818,469 B2 * | 11/2004 | Mori et al. | 438/52 |
| 6,882,516 B2 * | 4/2005 | Baniecki et al. | 361/321.1 |
| 7,029,971 B2 * | 4/2006 | Borland et al. | 438/250 |

OTHER PUBLICATIONS

Q. Zou, H. E. Ruda, and B. G. Yacobi, Improved Dielectric Properties of Lead Zirconate Titanate Thin Films Deposited on Metal Foils with LaNiO3 Buffer Layers, Applied Physics Letters, vol. 78, No. 9, Feb. 26, 2001, p. 1282-1284.

Won-Jae Lee and Ho-Gi Kim, and Soon-Gil Yoon, Microstructure Dependence of Electrical Properties of (Ba0.5Sr0.5)TiO3 Thin Films Deposited on Pt/SIO2/Si, J. Appl. Phys. 80, (10), Nov. 15, 1996, pp. 5891-5894.

M. H. Frey and D. A. Payne, Nanocrystalline Barium Titanate: Evidence for the Absence of Ferroelectricity in Sol-Gel Derived Thin-Layer Capacitors, Appl. Phys. Lett. 63 (20), Nov. 15, 1993, pp. 2753-2755.

Burtrand Lee, Jianping Zhang, Preparation, structure evolution and dielectric properties of BaTiO3 thin films and powders by an aqueous sol-gel process, Thin Solid Films 388 (2001), pp. 107-113.

Danielle M. Tahan, Ahmad Safari and Lisa C. Klein, Preparation and Characterization of BaxSr1-xTiO3 Thin Films by a Sol-Gel Technique, J. Am. Ceram. Soc. 79 (6), 1996, pp. 1593-1598.

Jon-Paul Maria, Kevin Cheek, Stephen Streiffer, Seung-Hyun Kim, Greg Dunn and Angus Kingon, Lead Zirconate Titanate Thin Films on Base-Metal Foils; An Approach for Embedded High-Permittivity Passive Components, J. Am. Ceram. Soc. 84 (10), 2001, pp. 2436-2438.

Paul, G. Clem, James A. Voigt, Elena R. Byhoff, Melanie Van Stry, Thomas J. Headley, and Nancy A. Missert, Control of Microstructure and Orientation in Solution-Deposited BaTiO3 and SrTiO3 Thin Films, J. Am. Ceram. Soc. 82 (9), 1999, pp. 2359-2367.

M. H. Frey and D. A. Payne, Grain-size effect on structure and phase transformations for barium titanate, Physical Review B, vol. 54, No. 5, Aug. 1, 1996-1, pp. 3158-3168.

E. Dien, J.-B. Briot, M. Lejeune and A. Smith, Relationship Between Processing and Electrical Behavior of BST Films Deposited by Spin Coating, Journal of the European Ceramic Society 19 (1999), pp. 1349-1352.

M. H. Frey and D. A. Payne, Nanocrystalline barium titanate: Evidence for the absence of ferroelectricity in sol-gel derived thin-layer capacitors, Appl. Phys. Lett 63 (20), Nov. 15, 1993, pp. 2753-2755.

Xiaoping Li and Wei-Heng Shih, Size Effects in Barium Titanate Particles and Clusters, J. Am. Ceram. Soc. 80 (11), 1997, pp. 2844-2852.

Maria Losurdo, P. Capezzuto, G. Bruno, G. Perna and V. Capozzi, N2-H2 remote plasma nitridation for GaAs surface passivation, Applied Physics Letters, vol. 81, No. 1, Jul. 1, 2002, pp. 16-18.

M. N. Kamalasanan, N. Deepak Kumar and Subhas Chandra, Structural, optical, and dielectric properties of sol-gel derived SrTiO3 thin films, J. Appl. Phys. 74 (1), Jul. 1, 1993, pp. 679-686.

M. N. Kamalasanan, N. Deepak Kumar and Subhas Chandra, Structural and microstructural evolution of barium titanate thin films deposited by the sol-gel process, J.Appl. Phys. 76 (8), Oct. 15, 1994, pp. 4603-4609.

M. N. Kamalasanan, N. Deepak Kumar and Subhas Chandra, Dielectric and ferroelectric properties of BaTiO3 thin films grown by the sol-gel process, J. Appl. Phys. 74 (9), Nov. 1, 1993, pp. 5679-5686.

* cited by examiner

THIN FILM CAPACITORS ON CERAMIC

This invention was made pursuant to a joint research agreement between E.I. du Pont de Nemours and the North Carolina State University, related to thin film capacitors, made on May 20, 2002 and effective Aug. 1, 2002 through Jul. 31, 2003, extended though Jul. 31, 2004 and further extended through Jul. 31, 2005 and through Jul. 31, 2006.

BACKGROUND

1. Technical Field

The present invention relates to thin film capacitors, more particularly to thin-film capacitors formed on ceramic substrates.

2. Related Art

As integrated circuits (IC) operate at higher and higher frequencies, noise in the power and ground lines associated with inductance and parasitic capacitance becomes an increasingly important problem. The noise problem requires the use of additional decoupling capacitors in order to provide a stable signal to an IC. Higher operating frequencies combined with lower operating voltages also require that voltage response times to the IC be faster and allowable voltage variations (ripple) be smaller. For example, as a microprocessor begins a calculation, it calls for power. If the response time of the voltage supply is too slow, the microprocessor will experience a voltage drop or power droop that exceeds the allowable ripple voltage and the IC will malfunction. Additionally, as the IC powers up, a slow response time will result in power overshoot. Power droop and overshoot are controlled by the use of capacitors that provide or absorb power within the appropriate response time.

Capacitors for decoupling and dampening power droop or overshoot are generally placed as close to the IC as possible in order to improve their performance. Conventional designs have capacitors surface mounted on a printed wiring board (PWB) and clustered around the IC. In this arrangement, a large number of capacitors requires complex electrical routing, which leads to inductance. As frequencies increase and operating voltages continue to drop, power increases and higher capacitance must be supplied at increasingly lower inductance levels. Placing the capacitors on the opposite side of the PWB (directly under the IC) reduces inductance somewhat. However, trends in IC size, speed, voltage, power, and packaging mean that conventional approaches will eventually be insufficient in supplying the capacitance within desired inductance and response times.

U.S. Pat. No. 6,477,034 to Chakravorty et al., discloses a capacitor having conductive paths therethrough and providing capacitance between at least two of the conductive paths, the capacitor comprising: a substrate layer; a first conductive layer deposited on the substrate layer, a first portion of the first conductive layer providing a first electrode region; a second conductive layer, a portion of the second conductive layer forming a second electrode region; and a dielectric layer disposed between the first and second conductive layers wherein capacitive regions are formed between the first electrode region and the second electrode region, wherein at least two conductive paths are provided through the substrate layer to provide conductive paths between opposite sides of the capacitor.

Thus, an object of the present invention is to provide capacitor(s) and method(s) for forming capacitor(s) that have desirable electrical and physical properties, such as low inductance and response times.

SUMMARY OF THE INVENTION

According to a first embodiment, a method of making a capacitor comprises providing a ceramic substrate having a first conductive layer. A thin-film dielectric is formed over the first conductive layer, wherein forming the dielectric comprises forming a dielectric layer over the first conductive layer and annealing the dielectric layer at a temperature of at least 800° C. A second conductive layer is formed over the dielectric, and the first conductive layer, the dielectric, and the second conductive layer form a capacitor.

Capacitors constructed according to the above method generally have high capacitance densities and other desirable electrical and physical properties. The capacitors can be, for example, mounted on printed wiring boards and on integrated circuit substrates, and can be used to form integrated circuit packages and integrated passive devices. Those skilled in the art will appreciate the above stated advantages and other advantages and benefits of various additional embodiments of the invention upon reading the following detailed description of the embodiments with reference to the below-listed drawing.

According to common practice, the various features of the drawings discussed below are not necessarily drawn to scale. Dimensions of various features and elements in the drawings may be expanded or reduced to more clearly illustrate the embodiments of the invention.

DETAILED DESCRIPTION

Methods of forming thin-film capacitors on ceramic and glass ceramic-substrates are disclosed. The capacitors are suitable for use as, for example, interposers, integrated passive devices, and for other uses. "Interposer" can refer to, in general, any small substrate containing capacitors or other passive components mounted on a printed wiring board. An interposer having one or more capacitors provides capacitance for decoupling and/or controlling voltage for integrated circuit die mounted on the interposer.

The interposer embodiments discussed in this specification can include capacitors of high capacitance density. "High capacitance density" generally indicates capacitance densities of at least 1 microFarad/cm$^2$. For the purposes of this specification, ceramic and glass-ceramic substrates are referred to generally as "ceramic substrates."

High capacitance capacitors on ceramic substrates according to the present embodiments have desirable electrical and physical properties. One desirable electrical property is low inductance because the capacitors can be placed directly beneath an IC. The electrical routing requirements are thereby minimized, considerably reducing loop inductance. One desirable physical property of the ceramic capacitor embodiments is a temperature coefficient of expansion (TCE) value that is between that of an organic printed wiring board (approximately $17 \times 10^{-6}/°$ C.) and that of an integrated circuit (approximately $4 \times 10^{-6}/°$ C.). This property provides stress reductions between the IC and the printed wiring board, which enhances long term reliability. Additionally, the temperature coefficient of expansion of the capacitor embodiments can be varied, depending upon the ceramic substrate used, to be closer to that of silicon or to that of an organic printed wiring board.

Figure 1:
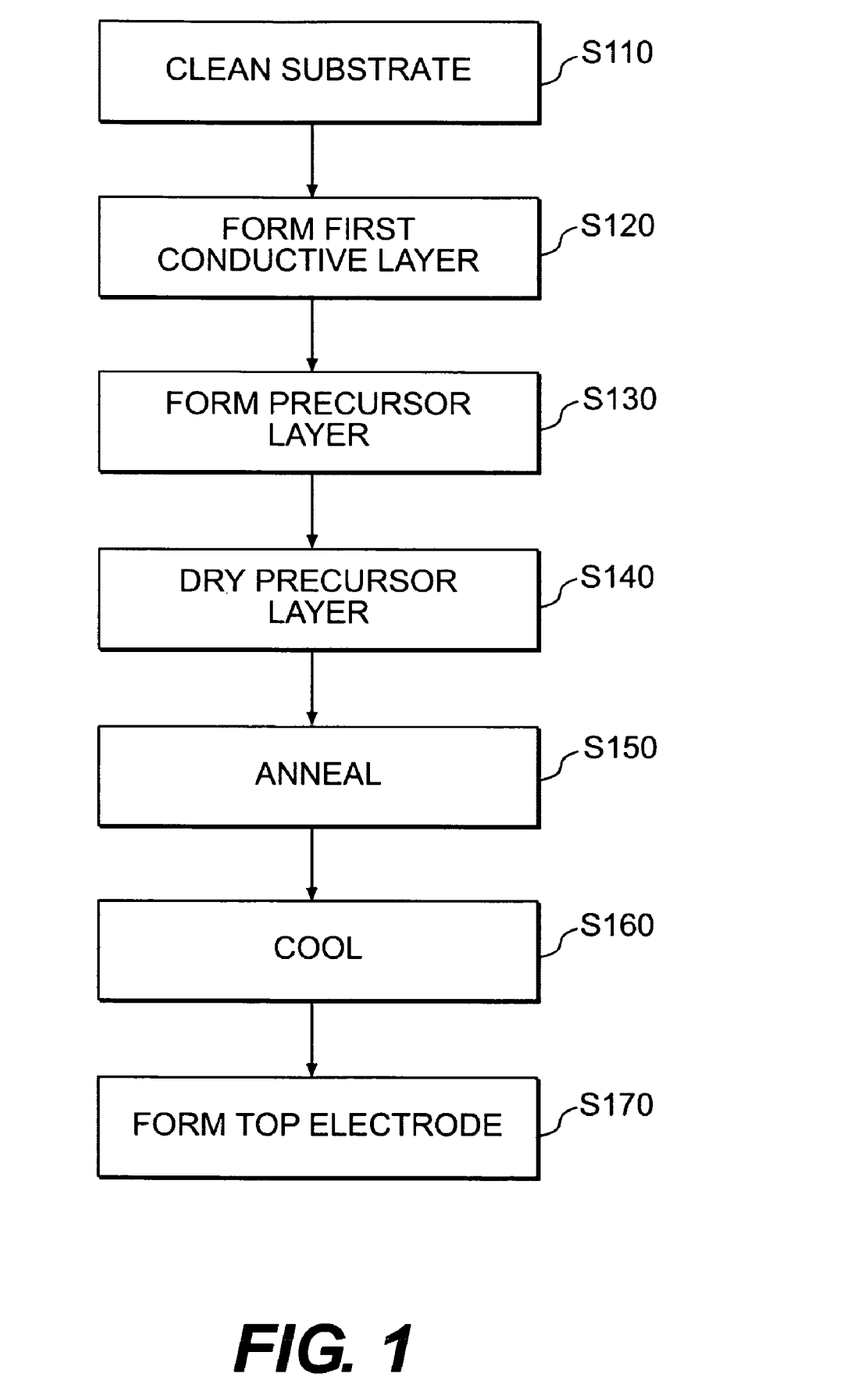
FIG. 1 is a block diagram illustrating a method for making a first embodiment of a capacitor.

FIG. 1 is a block diagram illustrating a method suitable for forming a capacitor on a ceramic substrate according to the present invention.

Figure 2A:
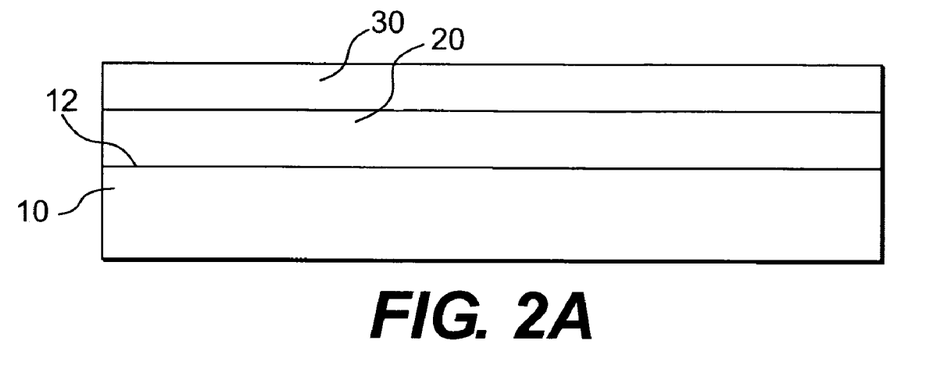
FIGS. 2A-2C illustrate steps in forming a capacitor according to the method illustrated in FIG. 1.
Figure 2B:
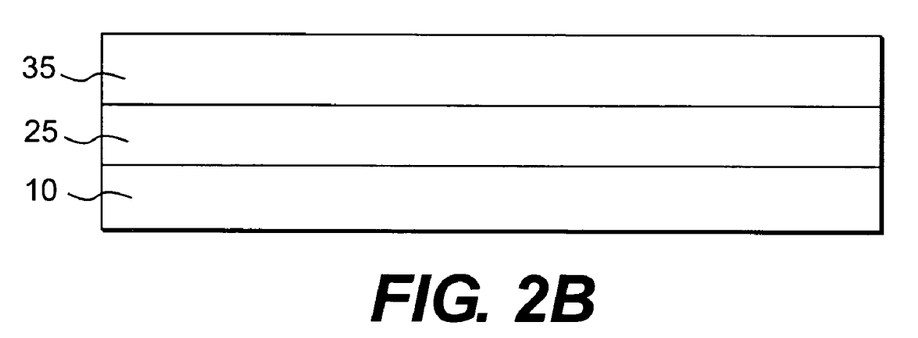
Figure 2C:
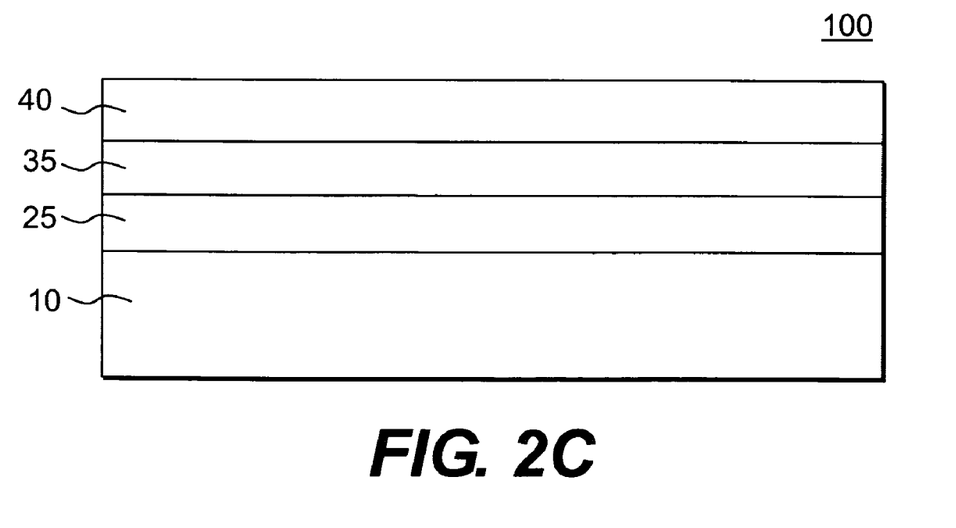

FIGS. 2A-2C illustrate manufacturing steps of the capacitor. The method illustrated in FIG. 1 and discussed in detail below addresses the formation of a single capacitor on a ceramic substrate. Several capacitors can be formed in a batch mode, however, using the method illustrated in FIGS. 1 and 2A-2C.

Referring to FIGS. 1 and 2A, in step S110, a thin-film grade ceramic substrate 10 having a smooth surface 12 is cleaned to remove organic or other impurities that may have detrimental effects on capacitor performance. If the substrate 10 has a rough surface 12, smoothening or polishing of the substrate surface to ensure a uniform and flat surface on which to form the thin-film electrode and dielectric layers may be performed as part of the cleaning process. As an alternative to polishing, a substrate with a rough surface may be planarized by coating and annealing one or more layers of dielectric precursor solution on the substrate 10 surface 12 prior to forming a first conductive electrode layer.

The substrate 10 may have a temperature coefficient of expansion that is similar to a $BaTiO_3$-based dielectric layer to be deposited over the substrate 10. Examples of such substrates include magnesia (MgO), alumina ($Al_2O_3$), barium titanate ($BaTiO_3$), strontium titanate ($SrTiO_3$), magnesium aluminate ($MgAl_2O_4$), yttria stabilized zirconia ($ZrO_2$) or glass-ceramic substrates such as any commercial low temperature co-fired ceramic substrates using precious or base metal metallization, or any commercial high temperature co-fired ceramic system using tungsten or molybdenum metallization. Use of such substrates ensures that a dielectric film will not experience large stresses when cooling down from annealing processes. Large stresses are undesirable because they may induce cracking in the dielectric film.

In step S120, a first conductive layer 20 is formed over the ceramic substrate 10. The first conductive layer 20 is used to form a first electrode of the finished capacitor. The first conductive layer 20 can cover all or part of the substrate 10. The first conductive layer 20 can be a precious metal such as platinum, or a base metal composition such as copper, and can be formed by a deposition process such as sputtering or evaporation. When the first conductive layer 20 is deposited by sputtering or evaporation, a thin layer (on the order of about 20 Angstroms thickness) of an adhesion enhancing material may be deposited over the substrate 10 before depositing the metal layer 20. Titanium is one example of an adhesion enhancing material. The first conductive layer 20 may also be formed by printing a thick-film metal paste composition or an organo-metallic material. If a co-fired ceramic substrate 10 is used, a first electrode may already be present as part of the substrate and step S120 may be dispensed with or bypassed.

In step S130, a dielectric precursor layer 30 is formed over the first conductive layer 20. The precursor layer 30 will form the dielectric of the resultant capacitor, and may be formed by depositing a precursor solution over the first conductive layer 20. The precursor solution may comprise precursor chemicals for forming thin-film crystalline barium titanate ($BaTiO_3$) layers, and chemical solution deposition (CSD) techniques may be used to form the precursor layer 30. CSD techniques are desirable due to their simplicity and low cost. A chemical precursor solution used to form an undoped (or "pure") $BaTiO_3$ dielectric may contain barium acetate and titanium isopropoxide. Chemicals such as acetylacetone, acetic acid and methanol may be used to dissolve the precursor components and to stabilize the precursor solution.

Dopant cations may be added to a $BaTiO_3$ precursor solution in order to modify its dielectric characteristics. Transition metal cations, for example, can be included. Transition metal cations with the oxide stoichiometry $MO_2$, where M is the transition metal cation (e.g., Zr, Hf, Sn, Ce), may be added to smooth the temperature dependence of the resulting capacitance by shifting the temperatures of the three phase transitions of $BaTiO_3$ closer to one another. Metal cations with the oxide stoichiometry MO, where M is an alkaline earth metal (e.g., Ca, Sr, Mg), may be added shift the dielectric Curie point to lower temperatures. Such MO and $MO_2$ dopants are useful for improving the temperature stability of the resultant capacitor. Rare earth cations having the oxide stoichiometry $R_2O_3$, where R is a rare earth cation (e.g., Y, Ho, Dy, La, Eu), may be added to chemically compensate for oxygen loss that may occur in the precursor layer 30 during a low oxygen partial pressure anneal. Transition metal cations with multiple preferred valence states such as Mn may also be added for their ability to chemically compensate for oxygen loss. Such dopants are particularly useful for maintaining high insulation resistance in capacitors that use base metal electrodes, such as copper.

Dopants or mixtures thereof may be used in concentrations of between about 0 and 30 mol percent in the precursor solution. The specific combination of dopants and mixtures will depend upon the desired combination of dielectric properties, transport properties, and temperature dependent properties for the resulting dielectric.

The following chemicals may be used to supply cations in doped precursor compositions:

Mn: manganese acetate tetrahydrate
Y: yttrium acetate hydrate
Zr: zirconium propoxide
Ca: calcium acetate hydrate
Sr: strontium acetate hydrate
Ho: holmium acetate hydrate
Dy: dysprosium acetate hydrate
Hf: hafnium chloride
Fe: Iron acetate
Mg: magnesium acetate tetrahydrate. In step S140, the precursor layer 30 is dried to remove solvent. If a thicker precursor layer 30 is desired, steps S130 and S140 are repeated until a desired precursor layer thickness is attained. Referring to FIG. 1, in step S150, the resulting article is annealed. Annealing is performed at a temperature of at least 800° C., which removes residual organic material, and then densifies and crystallizes the dried dielectric precursor layer 30. Referring to FIG. 2B, a dielectric 35 and a first electrode 25 result from the annealing process. The resulting dielectric 35 thickness may be in the range of about 0.2-2.0 microns (µm). The resulting article is then allowed to cool in step S160.

When using a precious metal such as platinum to form the first electrode 25, annealing may be conducted in a high temperature air furnace. When using a base metal such as copper to form the first electrode 25, annealing may be conducted in a low oxygen partial pressure environment. Oxidation of a base metal layer 20 is avoided by selecting an appropriate low oxygen partial pressure for the annealing temperature and the metal combination from phase stability diagrams. For example, if using copper electrodes, and annealing at about 900° C., the oxygen partial pressure should be less than $10^{-8}$ atmospheres.

In the case of a copper first electrode 25, the low oxygen partial pressure annealing will not oxidize the copper to $Cu_2O$ or CuO. The reduced oxygen partial pressures combined with higher annealing temperatures, such as annealing temperatures of at least 800° C., however, may yield a dielectric 35 with an increased concentration of oxygen vacancies, resulting in a reduced dielectric insulation resistance. The dielectric 35 may therefore require aleovalent cation doping and a re-oxygenation process. The dopants compensate for oxygen loss that may occur during the low oxygen pressure anneal, and after the re-oxygenation process yields a dielectric 35 with good insulation resistance. Such dopants include, for example, Mn, Y, Ho, and Dy.

Re-oxygenation may correspond to a short anneal at a lower temperature and at a higher oxygen pressure that is not sufficient to significantly oxidize the first electrode 25. Such a re-oxygenation may be at a partial pressure of oxygen of between $10^{-5}$ and $10^{-2}$ atmospheres for a few minutes at 500° C., for example. Re-oxygenation can be integrated into the cool-down step S160 of the high temperature anneal, or performed as a separate process. The re-oxygenation process is not necessary if a precious metal is used to form the first or bottom conductive layer 20, and the dielectric precursor layer may be annealed in air.

Referring to FIG. 2C, in step S170 (FIG. 1), a second or top electrode 40 is formed over the resulting dielectric 35. The second or top electrode 40 can be formed by, for example, sputtering, evaporation, combustion vapor deposition, electroless plating, printing or other suitable deposition methods, and may be followed by plating to a specific thickness in order to obtain desired electrical properties. A capacitor 100 is formed by the addition of the top electrode 40.

Figure 3A:
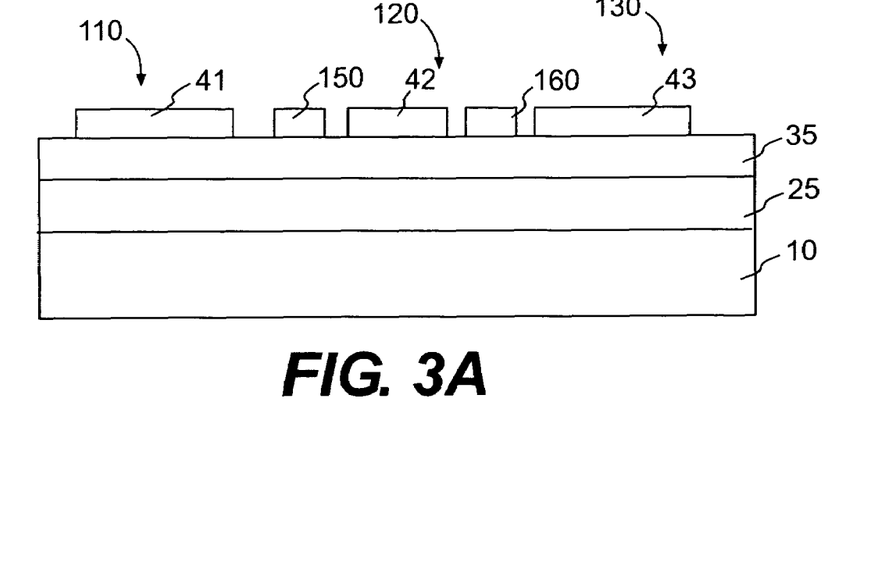
FIG. 3A is a section view taken on line 3A-3A in FIG. 3B of a plurality of capacitors formed from the capacitor illustrated in FIG. 2C.
Figure 3B:
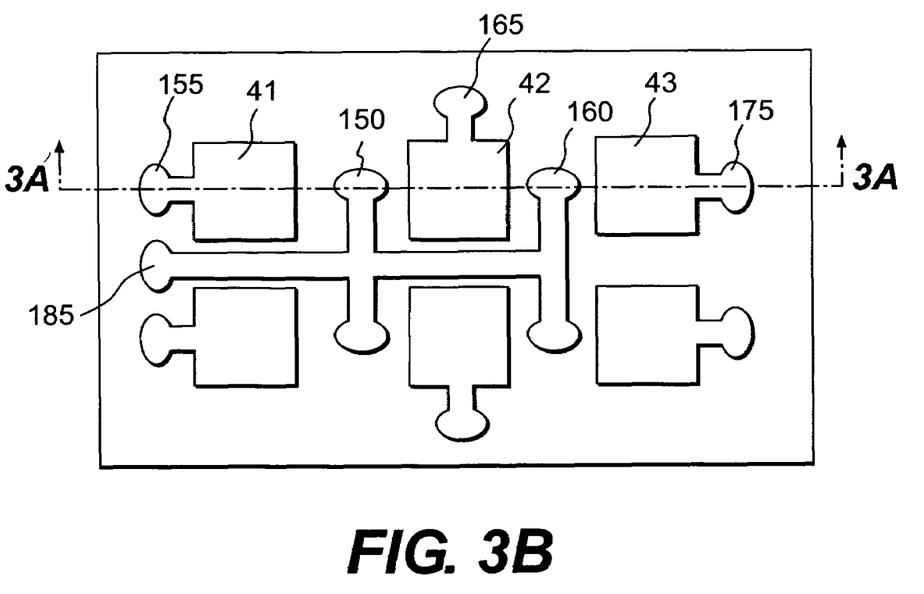
FIG. 3B is a top plan view of the capacitors illustrated in FIG. 3A.

FIGS. 3A and 3B illustrate a plurality of individual capacitors 110, 120, 130 that may be formed from the article resulting from step S170 (FIG. 1). Referring to FIG. 2C and FIGS. 3A and 3B, the second or top electrode 40 of the capacitor 100 may be photo-etched to form individual top electrodes 41, 42, 43, thereby forming the capacitors 110, 120, 130. The photoetching step can also be used form ground pin pads 150, 160, wire bond pads 155, 165, 175, and a ground wire bond pad 185. The wire bond pads 155, 165, 175 are used for connection to the individual top electrodes 41, 42, 43.

Figure 3C:
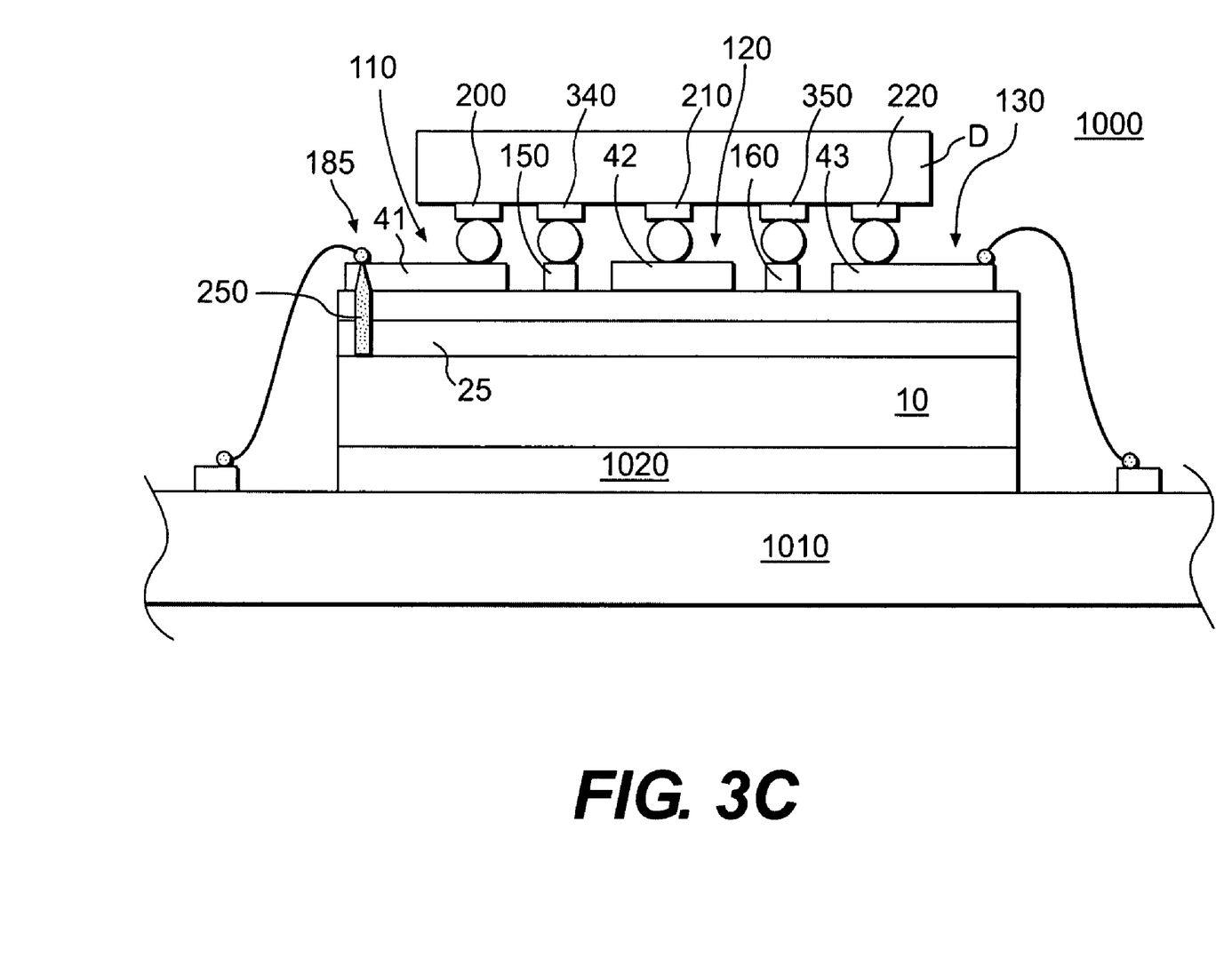
FIG. 3C is a sectional front elevational view of a chip package having a plurality of the capacitors illustrated in FIGS. 3A and 3B connected to a device D.

FIG. 3C is a front elevational view in section of a chip package 1000. The chip package 1000 comprises the article of FIGS. 3A and 3B mounted to a printed wiring board 1010 by an adhesive layer 1020. The capacitors 110, 120, 130 are coupled to a device D. The electrodes 41, 42, 43 of the capacitors 110, 120, 130 may be connected to individual power pins 200, 210, 220 of the device D using so-called "C4" (controlled collapse chip connect) techniques, for example. Ground pins 340, 350 of the device D are similarly connected to the ground pin pads 150, 160, and further connected to the first or bottom electrode 25 by way of a via 250 formed through the wire bond pad 185, thus completing a low inductance circuit for supplying power to the device D. The capacitors 110, 120, 130 on the substrate 10 form an interposer.

The device D may be, for example, an integrated circuit. One or more integrated circuits may be attached to the capacitors 110, 120, 130 on the surface of the ceramic substrate. Other attachment methods may be used such as die attach, flip chip, and wire bonding techniques.

In the above embodiment, for the purposes of illustration, a small number of capacitors, wire bond pads, ground pin pads, and other components are illustrated. Any number of such components, however, can be incorporated into a structure for supplying power to a device, or for other purposes.

These capacitors 110, 120, 130 illustrated above can be attached to printed wiring boards, integrated circuit substrates, or packages using, for example, adhesives. In the embodiment of FIG. 3C, wire bonding techniques are illustrated as electrically connecting the capacitors 110, 120, 130 to the printed wiring board (PWB) substrate 1010. Other methods of construction and electrical connection to a PWB substrate may also be used, including the use of vias through the ceramic substrate 10 in order to connect electrode and ground pads to the printed wiring board substrate 1010. This connection can be performed using conductive adhesive or solder in an area array interconnection configuration.

The top electrodes 110, 120, 130 and the various pads may also be formed by sputtering through a shadow mask, screen-printing or other techniques for providing a directly patterned top electrode structure.

If desired, multilayer capacitors can be fabricated by performing steps S110 through S170 and repeating steps S120 through S170 multiple times. A plurality of individual capacitors can be formed during each process. Multiple capacitor layers are desirable because of the increased total capacitance that can be achieved for a given projected substrate area.

Additional circuitry can be added to the top of the thin film capacitor interposer structures as described above. For example, additional low dielectric constant layers can be added by low-temperature processing, such as spin coating and curing, or by printing and curing polymeric dielectrics such as polyimide or epoxy-based materials. These dielectrics can be metallized and formed into circuit patterns using techniques that are standard in the packaging industry.

The thin film capacitor interposer embodiments of the present invention can be further processed into integrated passive devices by addition of other passive components onto the top of the thin film capacitor including inductors, resistors, or other capacitors. Inductors are readily formed from the top surface metallization using etching or other patterning techniques known in the art. Resistors may be formed using numerous techniques known in the art including sputtering of resistive metals, electroplating, screen printing and curing or firing, and other operations. Numerous integrated passive devices can be formed through the combination of these structures. Such integrated passive devices can be assembled or mounted onto integrated circuit packages or printed wiring boards using known techniques such as flip chip and wire bonding.

The term "thin-film" generally indicates layers having a thickness of less than 2 μm. The above embodiments can have capacitance densities in excess of 1 microFarad/cm$^2$.

The foregoing description of the invention illustrates and describes the present invention. Additionally, the disclosure describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The description is not intended to limit the invention to the form disclosed herein. Also, it is intended that the appended claims be construed to include alternative embodiments, not explicitly defined in the detailed description.

What is claimed is:

1. A method of making one or more thin-film capacitors on a substrate, comprising:
    providing a ceramic substrate having a first conductive layer thereon;
    forming a dielectric over the first conductive layer, wherein forming the dielectric comprises:
        forming a dielectric layer over the first conductive layer; and
        annealing at a temperature in the range of about 800° C. to 1050° C. and in an environment having an oxygen partial pressure of less than $10^{-6}$ atmospheres; and
    forming a second conductive layer over the dielectric, wherein the first conductive layer, the dielectric, and the second conductive layer form a capacitor.

2. The method of claim 1, wherein providing the substrate comprises:
    forming the first conductive layer over the substrate.

3. The method of claim 1, wherein forming a dielectric over the first conductive layer comprises depositing precursor chemicals for forming thin film crystalline barium titanate and wherein annealing results in a dielectric comprising crystalline barium titanate.

4. The method of claim 3 wherein a chemical precursor solution for forming dielectric contains barium acetate and titanium isopropoxide.

5. The method of claim 1, wherein the first conductive layer comprises at least one metal selected from the group consisting of: nickel, copper, manganese, molybdenum, and tungsten.

6. The method of claim 1, wherein annealing comprises:
    annealing in a nitrogen atmosphere.

7. The method of claim 1, wherein forming the dielectric comprises:
    providing a dielectric precursor solution; and
    depositing the dielectric precursor solution over the first conductive layer.

8. The method of claim 1, wherein forming the dielectric comprises:
    re-oxygenating the dielectric resulting from the annealing.

9. The method of claim 8, wherein re-oxygenating the dielectric comprises:
    re-oxygenating the dielectric at a temperature in the range of 450-600° C. and an oxygen partial pressure in the range of $10^{-2}$ to $10^{-5}$ atmospheres.

10. The method of claim 1, wherein forming the dielectric comprises:
    forming a doped dielectric.

11. The method of claim 1, wherein forming the dielectric comprises:
    forming a dielectric having a thickness in the range of about 0.2-2.0 microns.

12. The method of claim 1, wherein:
    the first conductive layer comprises at least one metal selected from the group consisting of: platinum, palladium, gold and silver.

13. The method of claim 1, wherein forming the second conductive layer comprises:
    sputtering a conductive layer over the dielectric; and
    plating the conductive layer with a conductive material.

14. The method of claim 1, wherein providing the substrate comprises:
    providing a substrate comprising at least one material selected from the group consisting of: magnesia, alumina, glass-ceramic, zirconia, magnesium aluminate, strontium titanate, and barium titanate.

15. The method of claim 1, further comprising:
    forming a plurality of electrodes from the second electrode layer, thereby forming a plurality of capacitors.

16. One or more capacitors made by the method of claim 1 mounted on a printed wiring board.

17. One or more capacitors made by the method of claim 1 mounted on an integrated circuit substrate.

18. An integrated circuit package comprising one or more capacitors made by the method of claim 1.

19. An integrated passive device comprising one or more capacitors made by the method of claim 1.

20. A method of making one or more thin-film capacitors on a substrate, comprising:
    providing a ceramic substrate having a first conductive layer thereon;
    forming a dielectric over the first conductive layer, wherein forming the dielectric comprises:
        forming a dielectric layer over the first conductive layer;
        annealing at a temperature of at least about 800° C.; and
        re-oxygenating the dielectric resulting from the annealing at a temperature in the range of 450° C. to 600° C. and an oxygen partial pressure in the range of $10^{-2}$ to $10^{-5}$ atmospheres; and
    forming a second conductive layer over the dielectric, wherein the first conductive layer, the dielectric, and the second conductive layer form a capacitor.

* * * * *

UNITED STATES PATENT AND TRADEMARK OFFICE
CERTIFICATE OF CORRECTION

PATENT NO.         : 7,256,980 B2
APPLICATION NO. : 11/005350
DATED              : August 14, 2007
INVENTOR(S)        : William Borland It is certified that error appears in the above-identified patent and that said Letters Patent is hereby corrected as shown below:

Title Page (73): Add Assignee Name: --E.I. du Pont de Nemours and Company, Wilmington, DE--

Signed and Sealed this

Twenty-eighth Day of August, 2007

JON W. DUDAS
*Director of the United States Patent and Trademark Office*